United States Patent [19]

Ramsey, Jr. et al.

[11] 4,248,844
[45] Feb. 3, 1981

[54] PRODUCTION OF SIC FROM RICE HULLS AND SILICA

[75] Inventors: David E. Ramsey, Jr., Johnson City; Lloyd I. Grindstaff, Elizabethton, both of Tenn.

[73] Assignee: Great Lakes Carbon Corporation, New York, N.Y.

[21] Appl. No.: 115,690

[22] Filed: Jan. 28, 1980

[51] Int. Cl.$^3$ .............................................. C01B 31/36
[52] U.S. Cl. ................................................... 423/345
[58] Field of Search ......................................... 423/345

[56] References Cited
U.S. PATENT DOCUMENTS 3,754,076  8/1973  Cutler .................................... 423/345

OTHER PUBLICATIONS

Lee et al., "Formation of Silicon Carbide from Rice Hulls", *American Ceramic Society Bulletin*, vol. 54, No. 2, (1975) pp. 195–198.
*Chemical Abstracts*, vol. 90, No. 89,552K.
*Chemical Abstracts*, vol. 82, No. 61,183B.

*Primary Examiner*—Brian E. Hearn
*Attorney, Agent, or Firm*—Adrian J. Good

[57] ABSTRACT

SiC whiskers are made by separating a quantity of rice hulls into two portions, carbonizing one portion in a non-oxidizing atmosphere, ashing the other portion in air, combining the carbonized residue and amorphous $SiO_2$ obtained, and heating in a noble gas atmosphere.

11 Claims, No Drawings

PRODUCTION OF SIC FROM RICE HULLS AND SILICA

BACKGROUND OF THE INVENTION

Silicon carbide in the form of whiskers with a high aspect ratio (of length to diameter) has been proposed for use as a reinforcement in aluminum metal to increase its modulus of elasticity, and greatly enhance its utility for the most critical aerospace applications. It has been reported that an addition of 25 volume % of SiC powder, of which about 20% was in the form of whiskers, increased the Young's modulus of the standard aircraft alloy 2024-T4 by approximately 100%, and the ultimate tensile strength by approximately 50%.

Silicon carbide occurs in two crystal forms, a $\beta$ cubic form and an $\alpha$ form in hexagonal and rhombohedral classes in a number of polytypes. Temperatures higher than 1800° C. favor the formation of the $\alpha$ form, and temperatures between 1200° to 1800° C. favor the formation of the $\beta$ form. The $\alpha$ type is preferred as an abrasive, while the $\beta$ form has been less important.

SiC whiskers have been made by the method disclosed by Cutler in U.S. Pat. No. 3,754,076, (1973); by Adamsky & Merz, *Z. Krist* 111, 350–361 (1959); and by Hamilton, *J. Appl. Phys* 31, 112–116 (1960); see Kirk-Othmer *Enc. Chem. Tech.* Vol. 4, 2nd Ed. Wiley & Sons, N.Y., 1964, (117–118). Kirchner, U.S. Pat. No. 2,018,133 (1935) disclosed the use of buckwheat hulls. Japanese Application No. 52/113,300 by Tokai Carbon, Oct. 3, 1978, discloses heating rice chaff in a high frequency induction furnace to form $\alpha$-SiC whiskers.

Considerable scientific study of whiskers has been done, and their properties have been found to be of great utility in reinforcing low modulus solids, but commercial development has been limited due to the extremely high cost of production. Typically they are produced in gas-phase reactions with low yields in expensive processes, which has limited availability.

One of the problems unsolved until the present invention was that of obtaining a reasonable yield of whiskers. When attempting to manufacture whiskers, about 20–25% of the SiC product obtained is the maximum obtained in the whisker form, the rest being irregularly shaped particles of little value as reinforcement.

It is difficult to separate the whiskers from the powder due to their small size. Mechanical screening is slow and imperfect, while air classification has so far been unsuccessful. Consequently, it is imperative to have the whiskers in high yield if the material is ever to become a large scale commercial product.

SUMMARY OF THE INVENTION $\beta$-Silicon carbide whiskers in good yield are produced from rice hulls. The hulls are ashed in air to obtain 20% yield of amorphous silica, which is in a favorable form for the production of SiC whiskers. Carbon is mixed with the silica and the mixture fired at carbide forming temperatures in an inert gas atmosphere to form the whiskers.

The carbon used may be formed by carbonizing rice hulls in an inert atmosphere at a preferred temperature of of 550° C. for approximately one hour, within a range of 400° to 700° C., and comminuting the product to a fine powder, or it may be a carbon flour manufactured from calcined petroleum coke.

The overall reaction is represented as $$SiO_2 + 3C \rightarrow SiC + 2CO.$$

The initial reaction is the reduction of silica to silicon by the reaction, starting at approximately 1000° C.:

$$SiO_2 + 2C \rightarrow Si + 2CO.$$

As the temperature increases to 1400°–1500° C., this reaction becomes very rapid. With excess carbon present the reaction procedes another step to form the carbide:

$$Si + C \xrightarrow{1400°-2000° C.} SiC.$$

The reactions of reduction and carbide formation above must be carried out in an inert atmosphere. If oxygen is present the carbon will merely oxidize to $CO_2$, and if nitrogen is present, silicon nitride will form preferentially over SiC by the reaction:

$$3\,Si + 2N_2 \xrightarrow{1300°} Si_3N_4.$$

We have found that argon is preferable, although other inert gases may be used.

It was found that whisker formation occurred in much greater yield when the reaction was carried out rapidly, and to that end, one preferred method is to mix the silica and carbon, then to load the mixture into a preheated furnace with an argon atmosphere at 1400° to 1600° C., giving a temperature increase of about 100° C. to 200° C./min.

The addition of a small amount of $Fe_2O_3$ or metallic iron also increases the speed of reaction, with quantities of 14% to 28% of the $SiO_2$ found useful, and promotes the formation of longer and greater diameter whiskers.

It is preferable to ash the rice hulls at temperatures between about 450° to about 700° C., as 450° C. is the lower practical limit. Above 700° C. the crystalline ash form predominates, or has at least a higher degree of crystallinity, and is less suitable as a reactant to form the SiC whiskers, giving a lower reaction velocity.

After the carbide forming step, the material may be ashed in air at 500° to 650° C. to remove excess carbon, treated with hydrofluoric acid if excess $SiO_2$ remains, or treated with hydochloric acid to remove any remaining $Fe_2O_3$.

DESCRIPTION OF THE INVENTION

EXAMPLE 1

A charge of rice hulls was carbonized for 1 hr. at 550° C. in nitrogen then milled to form an ultra fine C powder. A second charge of rice hulls was ashed in air at 620° C. to form a fine amorphous $SiO_2$ powder.

The C and $SiO_2$ obtained above were mixed, fired in an inert atmosphere using argon, for four hrs. at 1500° C. When the samples were removed from the furnace they were ashed in air at 620° C. to remove any excess C. A temperature range of 500° to 650° C. appears to give best results when ashing the whiskers to remove residual carbon.

Results of firing mixtures of varying blends of $SiO_2$ and C were as follows:

| SiO₂ addition to 100 parts by wt. carbonized rice hulls | % C present after 1500° C. Firing | SiC yield % Based on original raw charge |
|---|---|---|
| 0 | 56.0 | 11.2* |
| 5 | 45.0 | 12.4 |
| 10 | 34.5 | 13.6 |
| 15 | 22.2 | 15.1 |
| 20 | 17.1 | 15.8 |
| 25 | 10.1 | 16.0 |
| 30 | 3.2 | 16.4 |

*The theoretical maximum yield obtainable from the unmixed rice hulls is about 14%.

Based on these results, a 30% addition appeared to be near the optimum ratio for minimum excess C and maximum SiC yields. The product had approximately 20% whiskers with a diameter of about 0.5 to 1.5μ and a length of about 20 to 50μ. The aspect ratio of length to diameter was about 40 to 1.

EXAMPLE 2

A sample of rice hulls was pulverized in a vibramill, then ashed for one hour in air at 620° C. A mixture of 55% of the ashed hulls as the SiO₂ source and 45% calcined delayed petroleum coke flour as the carbon source was placed in a 3 in. diam. tube furnace in a graphite boat, with CO purge at 1.5 SCFH. In 15 minutes when the temperature reached 1500° C., the CO purge was discontinued and Ar at 4.0 SCFH passed through the furnace for the duration of the run of one hour. The product yield before ashing was 65.6% and after ashing at 620° C., was 43.4%, with qualitatively fair to good whiskers reported, in moderate yield.

EXAMPLE 3

Repetition of the above trial with (Darco) activated carbon powder as the carbon source using argon as the purge gas throughout the run gave a yield after ashing of 55.6% SiC product containing few whiskers.

EXAMPLE 4

Using a mixture of ashed rice hulls and 200 mesh graphite flour at a 55-45 by wt. ratio, and CO-Ar atmospheres as in Example 2 above, gave a yield after ashing of 44.8% SiC with some whiskers present in low yield.

EXAMPLE 5

A charge of rice hulls was pulverized in a vibramill, then ashed in air for one hour at 620° C., then mixed at 55-45% by wt. ratio with coke dust collected during calcination of raw petroleum coke. The mixture was placed in a boat in a 3 in. diam. tube furnace preheated to 1500° C. with a purge of 4.0 SCFH of argon. On reaching the temperature of 1500° C. in about 15 minutes the mixture was kept under those conditions of temperature and gas flow for one hour. On removal the product yield was 74.6% and after ashing at about 600° C., 52.6%.

The coke dust used here was collected as chamber fines during calcination of raw petroleum coke at 2400°-2500° F. in a rotating kiln with a typical screen analysis for particle size as follows:

| Screen | Cumulative % retained |
|---|---|
| + 6 | 0.3 |
| + 10 | 2.4 |
| + 20 | 12.3 |
| + 35 | 37.7 |
| + 60 | 71.1 |
| +100 | 91.4 |

The whiskers obtained were evaluated qualitatively as fair to good.

EXAMPLE 6

A charge of rice hulls was pulverized in a vibramill, carbonized for one hour at 550° C., ashed for one hour at 620° C. to amorphous SiO₂, then mixed with graphite flour at a 55-45% by wt. ratio. The mixture was placed in a preheated 3 in. diam. tube furnace at 1500° C. under an argon flow of 2.0 SCFH taking about 10 minutes to rise to temperature, and held for one hour at that temperature and gas flow. On removal from the furnace the product yield was 56.2% before ashing, and 35.8% after ashing for one hour at 620° C. Whisker content was evaluated as fair to poor whiskers.

We claim:

1. A process for the manufacture of SiC whiskers comprising the steps of:
    1—Carbonizing rice hulls in a non-oxidizing atmosphere at a temperature between about 450° to 700° C.;
    2—Comminuting the carbonized rice hulls to a fine powder;
    3—Ashing a second portion of rice hulls in air at a temperature between about 450° to 700° C.;
    4—Mixing the C and SiO₂ products thus obtained; and
    5—Heating the mixture thus obtained in an inert atmosphere at a carbide-forming temperature between 1400° to 1600° C. for a time sufficient to form SiC whiskers.

2. The process of claim 1 wherein from 10 to 30 parts of rice hull ash obtained in step 3 are added to 100 parts of the carbonized rice hulls obtained in step 1.

3. The process of claim 1 wherein the rice hulls are carbonized for approximately one hour at approximately 550° C. in nitrogen.

4. The process of claim 1 wherein the rice hulls are ashed in air for approximately one hour at approximately 620° C.

5. The process of claim 1 wherein the mixture from step 4 is held at approximately 1500° C. for approximately four hours.

6. The process of claim 1 wherein the inert atmosphere of step 5 is argon.

7. The process of claim 1 wherein from 14 to 28 parts of Fe₂O₃ or Fe is added to 100 parts of the SiO₂ from step 3.

8. A process for the manufacture of SiC whiskers comprising the steps of:
    (1) Oxidizing a first portion of rice hulls in air at a temperature from about 450° to 700° C. to form an ash;
    (2) Mixing said ash with a particulate source of carbon selected from the group consisting of graphite flour, activated carbon powder, and calcined petroleum coke, at a ratio of about 55 parts by wt. of said ash with 45 parts by wt. of said particulate carbon source;

(3) Placing the mixture thus formed in a chamber with an atmosphere of argon flowing continuously through said chamber in sufficient volume to displace essentially all the air in said chamber;

(4) Raising the temperature of said mixture from ambient to a preselected temperature within the range of 1400° to 1600° C. at an incremental rate of at least 100° C. per minute; and (5) Maintaining said mixture at the said preselected temperature in said argon atmosphere for about one hour.

9. The process of claim 1 or 8 wherein the product from step 5 is ashed in air at 500° to 650° C. to remove any remaining excess unreated C.

10. The process of claim 1 or 8 wherein the product from step 5 is treated with hydrofluoric acid to remove any remaining excess unreated $SiO_2$.

11. The process of claim 1 or 8 wherein the mixture of $SiO_2$ and carbon is heated rapidly from ambient temperature to a preselected carbide forming temperature within the range of 1400° to 1600° C., preferably 1500° C., at a rate of temperature increase of approximately 100° C. to 200° C. per minute.

* * * * *